United States Patent [19]
Chiang

[11] 4,343,878
[45] Aug. 10, 1982

[54] SYSTEM FOR PROVIDING PHOTOMASK ALIGNMENT KEYS IN SEMICONDUCTOR INTEGRATED CIRCUIT PROCESSING

[75] Inventor: Ping-Wang Chiang, Los Gatos, Calif.

[73] Assignee: Amdahl Corporation, Santa Clara, Calif.

[21] Appl. No.: 222,257

[22] Filed: Jan. 2, 1981

[51] Int. Cl.³ .............................................. G03C 5/00
[52] U.S. Cl. ........................................ 430/5; 430/22;
  430/311; 430/312; 430/394; 430/396; 357/85
[58] Field of Search ..................... 430/5, 22, 394, 396, 430/311–319; 356/401; 357/85

[56] References Cited

U.S. PATENT DOCUMENTS

| | | | |
|---|---|---|---|
| 3,666,463 | 5/1972 | Beynnon et al. | 430/394 |
| 3,690,881 | 4/1972 | King | 430/22 |
| 3,742,229 | 6/1973 | Smith et al. | 430/22 |
| 4,070,117 | 1/1978 | Johannsmeier | 356/401 |
| 4,118,230 | 10/1978 | Binder | 430/396 |

Primary Examiner—Mary F. Downey
Attorney, Agent, or Firm—Flehr, Hohbach, Test, Albritton & Herbert

[57] ABSTRACT

A system for providing photomask alignment keys in semiconductor integrated circuit processing involving selecting a common photomask subarea to be utilized as an alignment key pattern area on each photomask in the set with the alignment key pattern area having an array of sequential key locations. Each photomask after the first has a designated alignment key location which is either the same alignment key location as the immediately preceding photomask or the next alignment key location in the array. A mask key pattern is formed on the first photomask comprising aligning keys for all the associated higher numbered photomasks designed to be aligned to topography created by use of the first photomask in accordance with a mask alignment formula with each of the aligning keys being formed at key locations corresponding to the designated alignment key locations for the associated photomask. On each of the remaining photomasks of the set a mask key pattern is formed comprising an alignment key at the designated alignment key location and aligning keys for any associated higher numbered ones of the photomasks designed in accordance with the mask alignment formula to be aligned to the topography created by use of each photomask with each of the aligning keys being formed at a key location corresponding to the designated key location for the associated photomasks. On each photomask having a mask sequence number greater than two and being the first photomask in the set to have a particular designated alignment key location, a used key pair blot mark is formed at a key location immediately preceding the designated alignment key location for the mask.

The alignment key assignment process together with the use of used key pair blot marks provides a self-instructing alignment key pattern on each photomask to avoid having to make reference to extrinsic alignment instructions.

9 Claims, 39 Drawing Figures

MASK M1 BURIED LAYER
FIG.-21

MASK M2 ISOLATION
FIG.-22

MASK M3 COLLECTOR

MASK M4 ISOLATION PROTECT
FIG.-23

SYSTEM FOR PROVIDING PHOTOMASK ALIGNMENT KEYS IN SEMICONDUCTOR INTEGRATED CIRCUIT PROCESSING

This invention relates generally to semiconductor integrated circuit manufacturing technology and, more specifically, to a system for providing self-instructing mask alignment information on photomasks used in processing semiconductor wafers into integrated circuits.

Semiconductor processing technology for transforming a semiconductor wafer into a plurality of integrated circuit (IC) chips involves a complex sequence of process steps which must be accurately performed to produce a high yield of working chips among the large number of candidate dice on each processed wafer. One of the most critical aspects of semiconductor processing involves photolithography steps which are utilized to produce patterned masking layers on the wafer which, in turn, are utilized to create the topographical and topological structure of diffused regions, overlaying insulating layers, and conducting layers which comprise an integrated circuit. A typical semiconductor process involves a number of sequential photolithography operations, each of which must be performed in its proper sequence and with good process control in order to produce a high yield of good IC chips. One important aspect of good process control is accurate alignment of the topography pattern on each photomask after the first to wafer topography created by use of the prior photomasks in the sequence. If accurate photomask alignment is not achieved, all of the chips on the semiconductor wafer may be defective and, consequently, the overall process yield and cost of production will be adversely impacted.

Since semiconductor wafers are typically processed in batches involving a substantial number of wafers in each batch and since each wafer is subjected to the same photolithography steps at the same time, an error involving misalignment of a photomask in the photomask sequence may affect all of the wafers in the batch. Obviously, producing a complete batch of defective wafers results in a large adverse impact on process yield because of the large number of candidate dice on each wafer.

To assist the mask alignment operator in aligning a photomask to the topography pattern previously created on the wafer, it is standard operating procedure to provide alignment keys on the mask set so that the operator will have a specific alignment key on the mask to align with an aligning key produced on the wafer during an earlier photolithography operation. There are numerous approaches to providing alignment keys on photomasks throughout the semiconductor industry. One prior art approach is depicted in FIGS. 1 through 10 of the drawings and will be discussed in detail later. A general characteristic of all of the prior art approaches is that typically on each mask in the set after the first there is provided, not only an alignment key to be utilized for aligning that mask to an aligning key created on the wafer by a prior mask, but also aligning keys to be utilized to create on the wafer additional aligning keys to be used for alignment of subsequent photomasks. When the photomask alignment technician is presented with a particular photomask to be aligned to the wafer, it is generally not possible with prior art approaches to ascertain from looking solely at the mask and the wafer which is the alignment key on the mask and which is the aligning key on the wafer to be utilized. Consequently, the technician cannot find and use the alignment key without reading the detailed instructions for the mask set which are provided. Repeated reference to mask alignment instructions under conditions where a mask alignment technician is performing mask alignment operations for different mask sets and different semiconductor processes not only is a time-consuming part of the mask alignment operation but is fraught with possible errors in interpreting the instructions which can result in mask alignment errors and wafer yield loss. Consequently, the prior art approaches to providing alignment keys generally contribute to reduced throughput through the mask alignment stage of the process and increased yield loss in the overall semiconductor manufacturing process.

Accordingly, it is a principal object of this invention to provide an improved system for providing mask alignment information for a set of photomasks to be used in semiconductor processing.

It is a further object of this invention to provide a mask alignment key system which provides self-instructing mask alignment information on each set of photomasks.

It is another object of this invention to provide an improved approach to design and manufacture of integrated circuit chips.

It is a further object of this invention to provide a system for designing and manufacturing integrated circuit chips having lower yield loss at the mask alignment stage of the process.

In accordance with one aspect of this invention, the above-stated objects are achieved in a method for providing self-instructing mask alignment information on a set of photomasks designed to be used in number sequence during sequential photolithography steps in processing semiconductor wafers into integrated circuits wherein the topography pattern on each photomask in the set except the first one is required to be aligned to the wafer topography pattern created by use of at least one predetermined lower number photomask in accordance with a predetermined mask alignment formula for the set. The method includes the step of selecting prior to photomask design and generation a common photomask subarea to be used as an alignment key pattern area on each photomask in the set, with the alignment key pattern area having an array of sequential key locations. The method further includes designating for each photomask after the first one in the set an alignment key location which is either the same alignment key location as the immediately preceding photomask or the next alignment key location in the array. On the first photomask of the set is formed a mask key pattern comprising aligning keys for all associated higher number photomasks designed in accordance with the mask alignment formula to be aligned to the wafer topography created by use of the first photomask. Each of these aligning keys is formed at key locations corresponding to the designated alignment key location for the associated photomask. On each of the remaining photomasks of the set, a mask key pattern is formed comprising an alignment key at the designated alignment key location and alignment keys for any associated higher numbered ones of said photomasks designed in accordance with the mask alignment formula to be aligned to topography created by use of the photomask. Each of the aligning keys on a particular mask is formed at a key location corresponding to the designated key location for the associated photomask. On each photomask having a mask sequence number greater than two and which is the first photomask in the set to have a particular designated alignment key location is formed a used key pair blot mark at a key location immediately preceding the designated alignment key location for that mask. This used key pair blot mark provides the self-instructing mask alignment information on each photomask of the set.

In using photomasks produced in accordance with this method, the step of aligning photomasks having a blot mark thereon is facilitated by aligning the alignment key after the blot mark on the mask to the aligning key reproduced on the wafer at two key locations after the last blot mark, if any, already produced on the wafer. The step of aligning photomasks having no blot mark thereon is facilitated by aligning the alignment key on the mask to the aligning key reproduced on the wafer at one key location after the last blot mark, if any, previously created on the wafer. Consequently, the presence of a blot mark on any mask in the set after the second photomask directly informs the mask alignment operator which key on the mask is the alignment key and which are aligning keys for later photomasks. Furthermore, the blot mark on each mask is reproduced on the wafer so that the operator always knows to align the alignment key on the mask to the aligning key on the wafer which is two locations after the last blot mark. Consequently, the mask alignment technician is self-instructed by the alignment key pattern, including the blot mark on the mask and blot marks on the wafer, as to the alignment key on the mask and the appropriate aligning key on the wafer.

Correspondingly, for photomasks not having a blot mark thereon, the mask alignment technician is instructed that the first key on the mask is the alignment key and should be aligned to the aligning key on the wafer at one key location after the last blot mark, if any, produced thereon. Obviously, with respect to the third photomask in the sequence there will not be on the wafer a blot mark but the operator automatically knows that, if there is no blot mark on the wafer, the mask will be aligned either to the first or second aligning key on the wafer depending on the presence or absence of a blot mark on the mask which is to be aligned.

In accordance with another aspect of this invention a process is provided for design and manufacture of integrated circuit chips using a set of photomasks in number sequence during sequential photolithography steps involved in a particular semiconductor integrated circuit fabrication process with at least one of the photomasks being an opaque dark yield photomask. This process involves the steps of designing the set of photomasks while leaving first and second prearranged common subareas on each of the photomasks free of circuit topography with the first common subarea to be utilized as a mask coding pattern area and the second common subarea to be utilized as an alignment key pattern area which has an array of sequential key locations. On each of the photomasks is formed at the time of photomask generation a light field mask coding pattern in the mask coding pattern area. This mask coding pattern comprises a prearranged marked array of geometric areas together with a preselected indicia located in a prearranged one of the geometric areas indicating the particular mask sequence number for each of the photomasks. For each photomask after the first one in the set there is designated an alignment key location which is either the same location as the immediately preceding photomask or the next location in the array of sequential key locations. On the first photomask of the set is formed, at the time of photomask generation, a mask key pattern comprising aligning keys for all associated ones of the photomasks designed to be aligned to the topography pattern created by use of the first photomask. Each of these aligning keys on the first photomask is formed at the designated alignment key location for the associated aligned photomask. On each of the remaining photomasks of the set, a mask key pattern is formed comprising an alignment key at the designated alignment key location together with aligning keys for any associated higher number ones of said photomasks designed to be aligned to the topography created by use of that photomask. Each of the aligning keys is again formed at the designated alignment key location of the associated aligned photomask. Thereafter, on each photomask having a mask sequence number greater than two and being the first in the set to have a particular designated alignment key location is formed a used key pair blot mark at a key location immediately preceding the designated alignment key location for the mask. Using these masks a prearranged sequence of processing steps are performed on a semiconductor wafer including a prearranged sequence of photolithography processing steps each using one of the photomasks in sequence.

Each of the photolithography processing steps using a photomask which has a mask sequence number greater than one and is a light field photomask includes the step of aligning the photomask to the existing circuit topography pattern on the wafer by aligning the alignment key on the photomask at the designated key location for that mask to the aligning key reproduced on the wafer at that designated key location as a result of a photolithography process step using an associated lower number photomask. This aligning step utilizes the used key pair blot marks, if any, reproduced on the wafer as a result of prior photolithography process steps as a self-instructing mask alignment guide so that the step of aligning the light field photomask is facilitated by aligning the alignment key after the blot mark on the mask to the aligning key on the wafer located two key locations after the last blot mark previously created on the wafer. The step of aligning light field photomasks having no blot mark thereon is facilitated by aligning the alignment key on the mask to the aligning key on the wafer located one key location after the last blot mark, if any, previously created on the wafer. Each of the photolithography processing steps using a mask having a sequence number greater than one and being a dark field mask includes the steps of first coarsely aligning the photomask to the existing circuit topography pattern on the wafer by aligning the light field mask coding pattern on the mask with the mask coding pattern produced on the wafer as a result of prior photolithography processing steps and then finely aligning the photomask to the existing circuit topography on the wafer by aligning the alignment key on the photomask at the designated key location to the aligning key produced on the wafer at the designated alignment key location as a result of photolithography processing steps using an associated lower numbered photomask.

In accordance with another aspect of this invention a set of photomasks is provided which is adapted to be used in number sequence during sequential photolithography process steps in an overall process for manufacturing integrated circuit chips on a semiconductor wafer. The set of photomasks includes a mask key pattern formed in a common subarea of each photomask preselected to remain free of circuit topography patterns and to serve as an alignment key pattern area having an array of sequential key locations. Each of the photomasks after the first one has a designated alignment key location which is either the same location as the immediately preceding photomask in the sequence or the next location in the array of sequential key locations. The mask key pattern on the first photomask of the set comprises aligning keys for all associated higher number photomasks designed to be aligned to the topography pattern created by use of the first photomask, each of the aligning keys being formed at a key location corresponding to the designated key location for the associated aligned photomask. The mask key pattern on each of the remaining photomasks comprises an alignment key at a key location corresponding to the designated key location together with aligning keys for any associated higher numbered ones of the photomasks designed to be aligned to topography created by use of each said photomask. Each of the aligning keys is formed at a key location corresponding to the designated key location for the associated aligned photomask. Each of the photomasks which has a mask sequence number greater than two and is the first in the set to have a particular designated alignment key location also has a used key pair blot mark formed at a key location immediately preceding the designated alignment key location for that mask. As previously indicated this used key pair blot mark facilitates not only alignment of masks having the blot mark thereon but also any masks which do not have the blot mark formed thereon in the manner indicated above.

The alignment key system of this invention provides a number of important advantages over prior art alignment key systems. The principal advantage is the self-instructing feature provided by use of the blot marks in conjunction with a rigorous approach to sequential assignment of alignment key locations in an ordered array. Utilizing the system of this invention the mask alignment operator need not refer to lengthy alignment instructions for each semiconductor process or for each product made with a particular process. Consequently, the time required for performing the alignment function is substantially reduced.

In addition the self-instructing feature of the alignment key system of this invention eliminates the possibility of costly mask alignment errors. Not only is the self-instructing feature easily mastered by the mask alignment technician to avoid making mask alignment errors, but also the correctness of the alignment can be checked by quality control people by inspecting the wafer after photoresist development. Mask alignment errors can be caught and the wafers reprocessed through the same photolithography step. The avoidance of costly mask alignment mistakes will have an increasingly dramatic impact on reducing the manufacturing cost of integrated circuits as densities of such circuits increase, thereby producing a higher cost associated with wafer yield loss during processing.

Other objects, features, and advantages of this invention will become apparent from a consideration of the following detailed description taken in conjunction with the accompanying drawings.

FIGS. 1–10 depict sections of individual masks in a mask set using an alignment key system in accordance with one prior art approach.

FIGS. 11–20 depict sections of individual masks in a mask set using an alignment key system in accordance with this invention.

FIGS. 21–28 depict partial cross-sections of a semiconductor wafer at various stages in a bipolar manufacturing process using mask sets corresponding to those depicted in FIGS. 1–10 or FIGS. 11–20.

FIG. 34 illustrates a mask alignment formula for the photomask sets depicted in FIGS. 1–10 of the prior art and FIGS. 11–20 in accordance with this invention.

Figures 5, 15A:
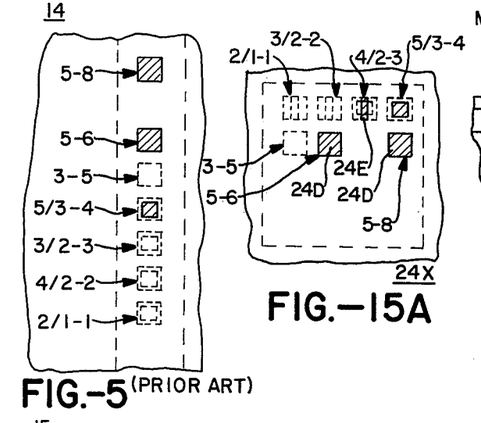
Figures 6, 7, 16A, 17A, 25, 34:
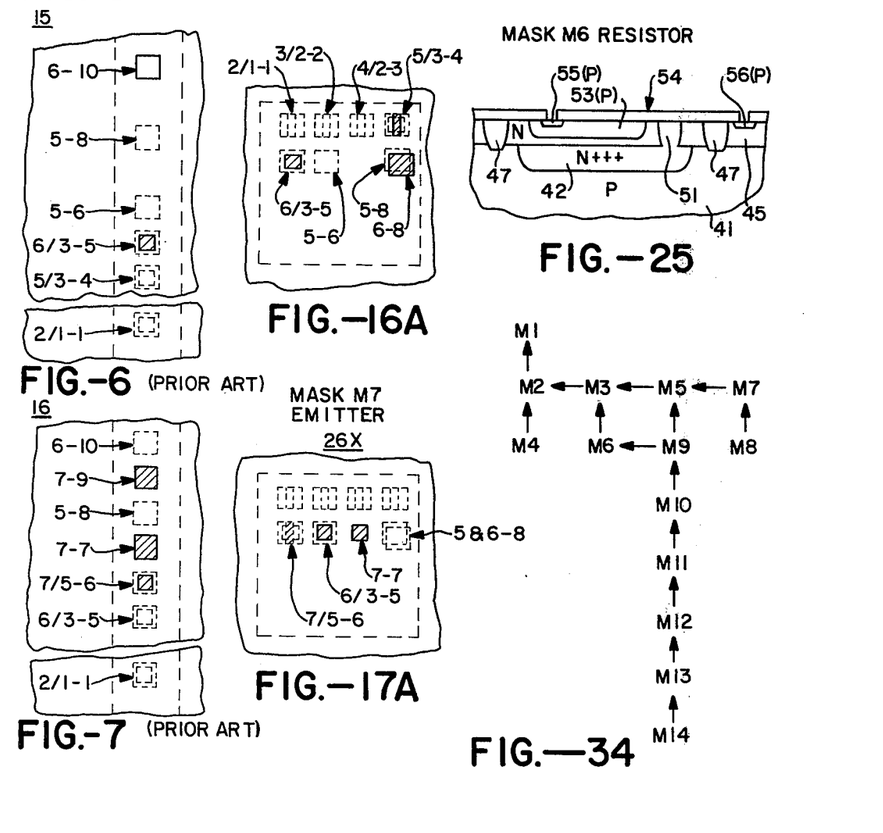
Figures 8, 18A:
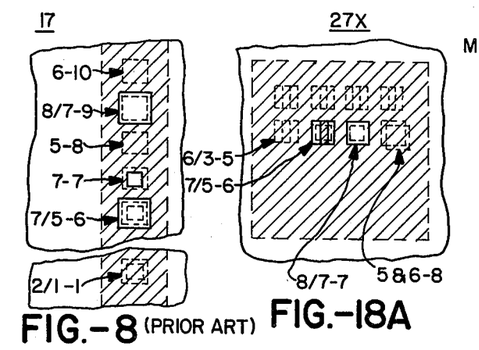

Referring now to FIGS. 1 through 10 in connection with FIGS. 21–28 and FIG. 34, a mask alignment key system in accordance with the prior art, together with bipolar circuit topology and topography created using these masks will be generally discussed. The bipolar process and associated mask sequence discussed is used solely as an example and other bipolar processes as well as other types of semiconductor technology could also employ this invention. FIG. 34 shows the mask alignment formula for a fourteen photomask set as illustrative of a prior art alignment key system and a companion bipolar semiconductor process which will generally illustrate the requirements for accurate alignment of each photomask after the first to the topography created on the wafer as a result of prior photolithography operations using earlier photomasks. As shown in FIG. 34, each of the mask numbers is identified by the indication M1, M2, M3, etc., in sequence through M14. Each of the masks will be utilized in sequence on sequential photolithography operations in carrying out a semiconductor process. In this instance the process that will be depicted is a prior art bipolar NPN integrated circuit process. As shown in FIG. 34, photomask M2 is to be aligned to the topography created using mask M1, masks M3 and M4 are to be aligned to the topography created using mask M2 and so forth. The arrows on the mask alignment formula indicate the prior photomasks to which the current mask is to be aligned. This mask alignment formula is not to be confused, however, with the mask alignment instructions which the photomask alignment technician must utilize to perform the actual mask alignment operation. This simply gives a formula for the mask designer to place the alignment keys on the photomasks in the proper manner.

Figures 1, 11, 21:
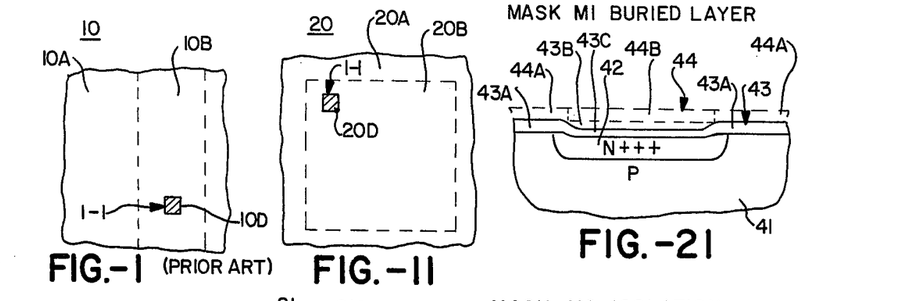

FIG. 1 depicts an enlarged view of a small section of a photomask 10. The area 10A of the photomask is generally the area in which the integrated circuit topography pattern is formed and the area 10B refers to an area of the photomask devoted to the alignment key system. Generally each photomask contains an array of identical circuit topography patterns which will be utilized to form a large number of identical topography patterns on each wafer being processed through the manufacturing operation. Each of these identical circuit topography patterns will have an alignment key area 10B associated with it so that the photomask operator may generally utilize any of the repeated mask alignment areas on the photomask for the mask alignment operation. Usually the operator will utilize a split field alignment microscope so that alignment keys at two locations on the photomask may be utilized simultaneously to avoid any parallax errors which might occur if a single alignment key were used.

The first mask 10 (M1) in the mask sequence will generally have in the mask alignment area 10B a number of aligning keys 10D formed therein corresponding to the number of subsequent masks which are to be aligned to the topography created using mask M1. This is the general case but it should be understood that, in some instances, more than one subsequent mask will be aligned to the same aligning key created by a prior photomask. In the exemplary case to be discussed here, mask M1 has only one aligning key 10D formed thereon since, according to the mask alignment formula of FIG. 34, only mask M2 is to be aligned to the topography of mask M1. As shown in FIG. 1, the aligning key 10D is given the designation 1-1. This designation will be used for convenient reference to the aligning key's location and the mask number which created it. In this case the reference 1-1 indicates via the first number that the aligning key referred to was created on mask number 1 in the sequence and the second number 1 indicates the location of the aligning key, namely location 1 in this instance.

The first mask M1 in a mask set is not required to be aligned to any topography previously created on the wafer. In the exemplary process to be discussed mask M1 is utilized to form a buried layer structure in a semiconductor wafer as illustrated in FIG. 21. FIG. 21 illustrates the cross-sectional topology of semiconductor wafer 41 after a photolithography process has been carried out using the mask M1 and a diffusion of N-dopant material into wafer 41 to created buried layer region 42 has been performed. The sequence of processing steps utilized to create this wafer topology will be briefly described. Initially the wafer 41, in this case a P-doped silicon wafer, is simply a plain wafer. The first step generally is to form a uniform layer of masking material 43 on the surface of wafer 41. This masking layer may be a silicon dioxide layer grown on wafer 41 by heating it in an oxygen atmosphere or it may comprise a sandwich of silicon dioxide and silicon nitride with the layer of silicon dioxide first grown on wafer 41, followed by deposition of a silicon nitride layer.

To define the areas of the wafer 41 in which the buried regions 42 are to be created, a photolithography operation is performed to pattern the masking layer 43. Generally this photolithography operation involves first coating the wafer with a layer of photoresist 44. Thereafter, the photoresist layer 44 is exposed through the mask M1 creating areas of photoresist layer 44 which are hardened by being exposed to the light and areas which remain soft because they have been shielded from exposure by the opaque areas in mask M1. This relates to a description of a negative-type photoresist process utilizing a light field photomask which is the type illustrated in FIG. 1. The exposure of photoresist layer 44 through the mask M1 may be accomplished either in a contact printing operation with the photomask laying directly over the photoresist layer 44 or by way of a projection printing system in which the image of the photomask is projected onto the wafer using an optical projection system.

In the structure depicted in FIG. 21, photoresist layer 44 is shown in dashed lines. The sections 44A of photoresist layer 44 correspond to the areas which are exposed to light through transmitting portions of photomask M1 and the area 44B corresponds to unexposed areas. After the photoresist layer 44 has been exposed through the mask M1, the unexposed regions 44B are removed in a developing process using a standard photoresist developer. After this step, the region 44B will have been removed leaving the regions 44A on the wafer. The next step is to pattern the masking layer 43 corresponding to the pattern in the photoresist layer 44. This is performed by using an etching step, employing an etchant which attacks the masking layer 43 only in regions which are not covered by the photoresist layer. Accordingly, the region 43B of masking layer 43 will be attacked by the etchant and removed down to the surface of the wafer 41 while the regions 43A will remain on the wafer.

After this etching operation has been performed, the patterned photoresist layer 44 will be removed and the wafer 41 will then be subjected to a diffusion operation, for example in a diffusion furnace, to create highly N-doped region 42. The doped regions in the substrate 41 will be determined by the openings in the masking layer 43 created during the photolithography operation. This diffusion of an N-dopant material, such as phosphorus, into wafer 41 will be carried out in an atmosphere containing oxygen so that, during the diffusion, a silicon oxide layer 43C will be grown over the diffused region 42 generally in the unmasked area 43B. If the masking layer 43 is simply silicon dioxide, the silicon dioxide regions 43A will grow to a greater thickness during the diffusion process and will always remain thicker than the oxide grown in the region 43C during the diffusion process. In addition, during the diffusion-oxidation process, the oxide grown in the region 43B will consume a higher amount of the surface regions of silicon wafer 41, producing the generally indented wafer surface topology depicted in FIG. 41. In other words, a greater amount of silicon will be consumed in forming the silicon dioxide layer 43C than is consumed in additional growth of the oxide layer 43A.

The topography depicted in FIG. 21 related to creation of buried layer 42 will be essentially the same as the topography created in the wafer in the alignment key area utilizing the alignment key masking section 10D shown in FIG. 1. Aligning key 10D is an opaque area of photomask 10 (M1). Thus in the region of the wafer corresponding to aligning key 10D, the same wafer topography will have been created. If the wafer surface is viewed through a microscope after these process steps have been performed the topology of the wafer will be visible as regions of different heights.

Figures 12, 22:
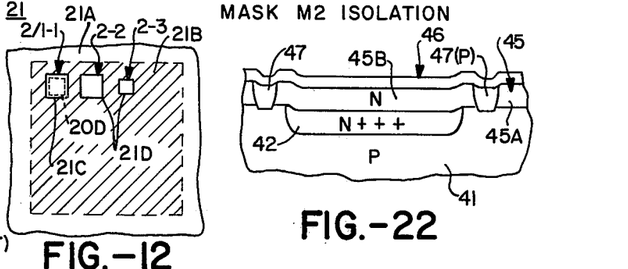

The next step in the typical bipolar process is to remove the masking layer 43, and then to form an N-doped epitaxial layer 45 on the surface of wafer substrate 41. In forming this epitaxial layer 45, the topography and topology of the substrate 41 will still generally be maintained, as shown in FIG. 22. FIG. 22 depicts the topography and topology of a section of the wafer after the next photolithography patterning and diffusion operations have been carried out to create isolation regions 47 surrounding the buried layer region 42. Referring back momentarily to FIG. 21, it should be understood that, if the masking layer 43 is an oxide-nitride sandwich, during the diffusion of the buried layer 42 no oxide growth will occur in the regions 43A and the growth of oxide layer 43C will consume silicon from substrate 41 and create the indented substrate topology depicted in FIG. 21. In any event, when the masking layer 43 is removed, the differential height of the substrate surface will be present in both instances. It should thus be understood that prior to the second photolithography operation utilizing mask M2 and the alignment key arrangement depicted in FIG. 2, the wafer consists simply of the substrate 41 with the epitaxial layer 45 formed thereon together with the buried layer regions 42 in areas of the wafer including the areas defined by aligning key 10B in FIG. 1. As shown in FIG. 22, the next sequence of process steps, including the next photolithography operation using mask M2, is to be performed to create P-doped isolation regions 47 which extend through the epitaxial layer 45 and which would be seen to totally surround the buried layer region 42 if viewed from the top. However, it is important that there be maintained a separation distance between the P-doped isolation regions 47 and the buried layer region 42. Consequently, it is vital to creating an operative integrated circuit that the second mask alignment be performed accurately so that the P-doped wells 47 will not contact the buried region 42.

Figure 2:
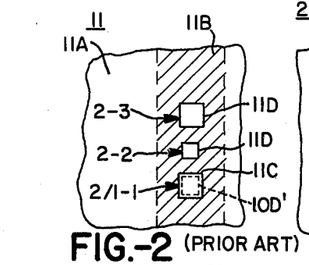

FIG. 2 depicts the alignment key pattern on mask 11 (M2) which in this case is a dark field mask as signified by the shaded region 11B serving as the alignment key area. As shown in FIG. 2, the alignment key pattern in alignment key subarea 11B consists of an alignment key 11C and two aligning keys 11D, one of the aligning keys 11D designated 2-2 being a square smaller than alignment key 11C and the other aligning key designated 2-3 being a square the same size as alignment key 11C. The dashed square designated 10D' in FIG. 2 represents the aligning key reproduced on the semiconductor wafer 35 by the aligning key 10D depicted in FIG. 1. As shown in FIG. 2, the mask 11 is depicted in a position where the alignment key 11C on mask 11 is aligned with the aligning key 10D' on the wafer. This is the goal of the aligning operation, but consider the steps that the photomask alignment operator must go through to achieve this alignment.

When the photomask alignment operator initially positions the photomask 11 (M2) in the field of view of the aligning microscope, the operator will first find the alignment key pattern area 11B and note the alignment key pattern thereon. From this inspection alone, there is no way that the operator can tell which of the square keys in the alignment key pattern area is the alignment key and which are aligning keys for subsequent photomasks. When the photomask alignment operator finds the aligning key 10D' on the wafer, the operator will not know whether to align the large key 11C or the large key 11D to the aligning key 10D' which is visible on the wafer. Reference to detailed alignment instructions in a separate document is required. If the operator makes a mistake, either by not referring to the instructions or misinterpreting the instructions, and aligns the large square 11D designated 2-3 instead of the large square 10D' designated 2/1-1 as the alignment key, then the topography created using the mask 11 will be out of alignment with the topography created using the mask 10 and a defective wafer will result. In particular, what will happen is that the isolation wells 47 depicted in FIG. 41 will encroach on the buried layer region 42 and will thus not serve their purpose as isolation wells.

It will thus be seen that the mask alignment operator must carefully read and interpret the separate alignment instructions for that particular photomasks in order to determine that the key designated 2/1-1 is the alignment key and the keys designated 2-2 and 2-3 are the aligning keys. The designation 2/1-1 will be utilized with the number before the slash mark indicating the current mask sequence number, in this case 2, the number following the slash mark indicating the prior mask sequence number to which the current mask sequence number is to be aligned and the number following the dash mark indicating the alignment key location in the alignment key area of the mask which corresponds to the key location reproduced on the wafer. Consequently, the designation 2/1-1 indicates the alignment key on the second photomask which is to be aligned to an aligning key created on the wafer by the first photomask at alignment key position number 1. Of course this designation does not appear on the photomask itself, but is only discernible from separate instructions to the operator.

If the mask alignment operator properly interprets the instructions and aligns the photomask 11 in the manner shown in FIG. 2, the accompanying photolithography operation together with following etching and diffusion operations will produce the correct wafer topology and topography shown in FIG. 22. The sequence of process steps involving photoresist pattern definition, etching of the masking layer 46, removal of the patterned photoresist layer (not shown), and diffusion-oxidation of the wafer to create the P-doped regions 47(P) involve a standard sequence of semiconductor processing steps and need not be described in detail here since it is similar to that which was described in connection with FIG. 21. The end result, if properly carried out, is the structure shown in FIG. 22 with a wafer surface topography and topology which is visible as areas of differential height on the wafer surface when viewed through a microscope. It will thus be appreciated that the used alignment key pair designated 2/1-1 will be visible on the wafer surface as will be the aligning keys designated 2-2 and 2-3 in FIG. 2 created at corresponding key locations on the wafer.

Having now described generally how the topology and topography of the wafer is created using photolithography and associated etching and diffusion steps, the remainder of the description in conjunction with FIGS. 23 through 28 of the drawings will be simplified and the general topography of the wafer only will be illustrated without attempting to depict the corresponding wafer surface topology because of the complexity of attempting to depict such topology. A person skilled in the semiconductor industry will readily understand the creation of that surface topology and thus it need not be depicted in detail for purposes of discussing the alignment key system of the prior art and that of this invention.

Figures 3, 4, 13A, 14A, 23:
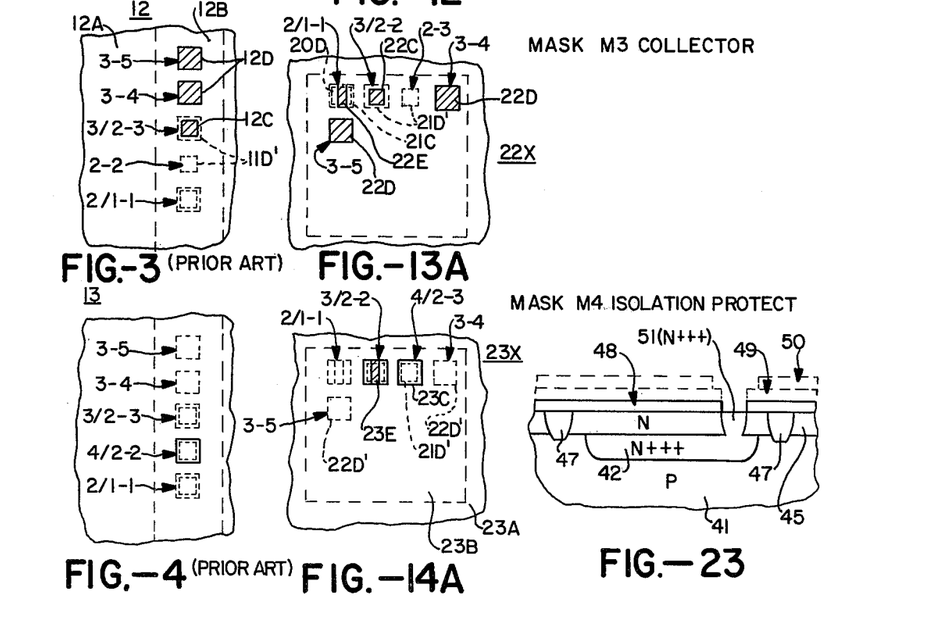

The next mask, M3, in the exemplary process being discussed is utilized to produce a heavily N-doped collector region 51 communicating between the surface of epitaxial layer 45 and the buried layer region 42. As depicted in FIG. 3, the alignment key pattern on mask 12 (M3) consists of an alignment key 12C designated 3/2-3 and two aligning keys 12D designated respectively 3-4 and 3-5. Again in FIG. 3 the used alignment key pair created on the wafer in prior photolithography operations is designated 2/1-1 and is shown in dashed lines. Similarly the aligning key 2-2 and the aligning key 2-3 created using mask 11 in FIG. 2 are shown in dashed lines.

Consider the problem of the photomask alignment operator in determining which key on photomask 12 is the alignment key. The range of possibilities are that the mask key designated 3-4 is the alignment key and should be aligned to the aligning key on the wafer designated 2-2, or the mask key designated 3-5 is the alignment key and should be aligned with the aligning key 2-2 on the wafer, or the mask key designated 2/2-3 is the alignment key and should be aligned as depicted in FIG. 3. Again, without reference to specific instructions the photomask alignment operator cannot tell which is which and thus the possibility exists for misinterpretation of instructions or improper assumptions on the operator's part as to how to perform the alignment.

If a mistake occurs with respect to aligning mask 12 to the topography on the wafer shown in FIG. 22, it will be apparent that the N-doped region 51 might either end up being located too far to the right so that it encroaches on the isolation region 47 or it may end up positioned too far to the left. In the latter case, since the diffused base region 53 depicted in FIG. 24 will be located on the wafer by aligning an associated photomask with the aligning key created by mask 12 (M3), a misalignment of the doped region 51 to the left, could later result in the base region 53 also being pushed to the left and encroaching upon one of the isolation regions 47. Either of these possibilities produces a defective wafer which must then be scrapped.

As depicted in FIG. 23, the creation of the heavily N-doped region 51 utilizes two separate photolithography operations in the particular technology depicted for this exemplary semiconductor process. Consequently, two photoresist layers 49 and 50 are shown in FIG. 23, the first layer 49 being patterned using the mask M3 and the second layer 50 being patterned using the mask M4. The purpose of this dual photolithography operation is to guard against the possibility of pinholes which might be formed in the first photoresist layer 49 later causing unwanted N-doped regions in the wafer. The second photoresist layer 50 will generally cover any pinholes in the first photoresist layer 49 and any pinholes in layer 50 will generally not be in registration with the pinholes in the layer 49. In modern photolithography technology, the double resist layer approach is not required, and thus only one mask corresponding to mask 12 (M2) of FIG. 3 is required.

As shown in FIG. 4, the mask 13 (M4) which is utilized to pattern photoresist layer 50 depicted in FIG. 23 has only one alignment key 4/2-2 formed thereon. Consequently, there is no problem for the operator to discern which is the alignment key. However, without referring to alignment instructions for mask M4 the operator would not know whether the alignment key on the mask was to be aligned to the aligning key on the wafer at position 1, 2, or 3. If mask 13 (M4) were misaligned with respect to mask M3, the dual photoresist layers 49 and 50 would not have coincident patterns therein and could not be used to properly define the mask pattern in masking layer 48 to define the N-doped region 51.

As can be seen in FIGS. 5 through 10, the mask alignment situation becomes progressively more complicated in the illustrative prior art approach as more and more used and unused alignment key pairs are produced on the wafer and as the key pattern involving alignment keys and aligning keys on each mask become more complex. As shown in FIG. 5, mask 14 (M5) has one alignment key at position 4 and two aligning keys at positions 6 and 8. The proper alignment of mask 14 (M5) is accomplished if the alignment key at position 4 is aligned with the aligning key at position 4 on the wafer created by mask number 3 as indicated by the designation 5/3-4 in FIG. 5. Again the operator would have to refer to detailed mask alignment instructions to know that the alignment key on the mask representing the small opaque square designated 5/3-4 is to aligned with the aligning key at position 4 on the wafer rather than the one at position 5. Another possibility would be to reuse an aligning key at positions 1, 2, or 3.

Figure 24:
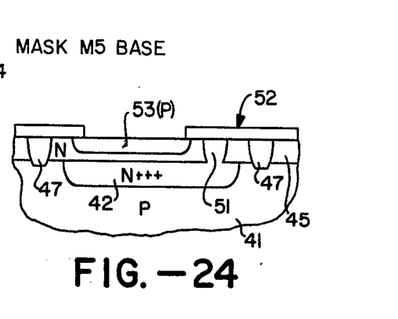

FIG. 24 shows the wafer topography which is created using photolithography etching and diffusion process steps in connection with mask M5. As can be seen if the mask alignment operation is not properly carried out the base region 53 may encroach upon the collector diffusion 51 or upon the isolation region 47, either misalignment producing a defective wafer.

FIG. 6 shows that the proper alignment of mask M6 is to use the small alignment key designated 6/3-5 to align to the aligning key at position 5 on the wafer which was created in connection with mask number 3. Referring to FIG. 25, this sixth mask 15 (M6) in FIG. 6 is utilized in connection with photolithography etching and diffusion operations to create both a resistor area 56(P) and a contact region 55(P) for the base region 53(P). Again the mask alignment operator would have to refer to detailed instructions to identify the alignment key on mask M6 and to identify which aligning key on the wafer it should be utilized with.

Figure 26:
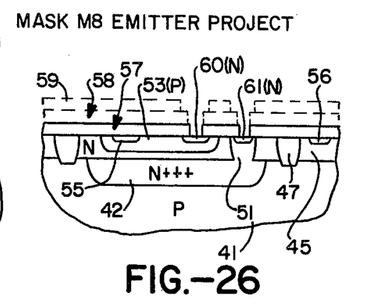

FIG. 7 shows the alignment key pattern on mask 16 (M7) and the proper alignment position of that mask with respect to the aligning keys on the wafer. As can be seen, mask 7 is aligned to mask 5 using alignment and aligning keys at position 6 in accordance with the designation 7/5-6 in FIG. 7. The corresponding wafer topography created using mask M7 is depicted in FIG. 26. Again mask 7 and 8 are utilized in connection with a double layer photoresist, double masking operation as depicted in FIG. 26. Mask 16 (M7) is used to pattern photoresist layer 58 and mask 17 (M8) is utilized to pattern photoresist layer 59. These dual masking operations are utilized to define a pattern in masking layer 57 which, in turn defines the location of N-doped emitter region 60(N) and an N-doped contact region 61 in the surface of collector diffusion 51. Again detailed mask alignment instructions would have to be referred to by the photomask alignment operator in order to properly align mask M8 with respect to mask 7 and to align mask M7 with respect to the topography created by mask M5 so that the emitter region 60(N) will be properly located within the base region 53(P).

In these latter stages of wafer processing, the manufacturing cost investment in the inprocess wafers in each batch is becoming more substantial and thus proper mask alignment is even more critical to achieving high process yield and low manufacturing cost. Producing a defective wafer at a late stage in the process sequence is a more costly mistake than at earlier stages in the process. Yet the mask alignment operation if anything becomes more difficult as the complexity of the alignment key patterns on the masks and wafers increases.

Figures 9, 19A:
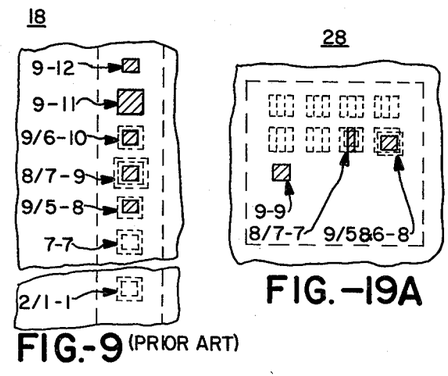
Figures 10, 20A, 28:
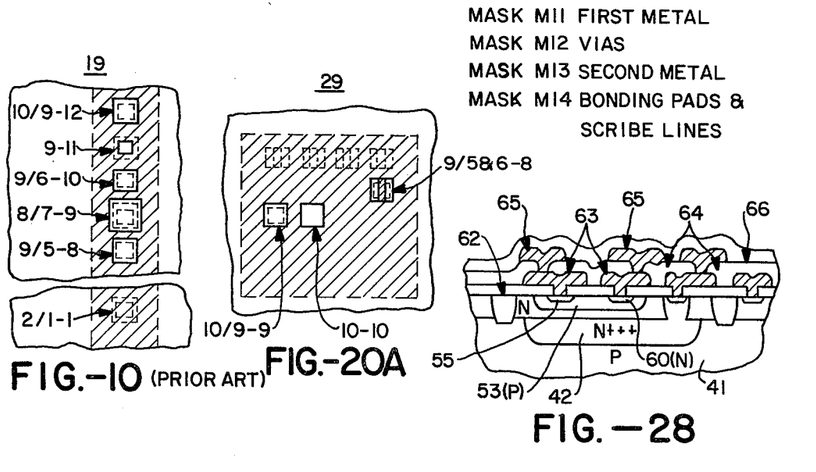
Figure 27:
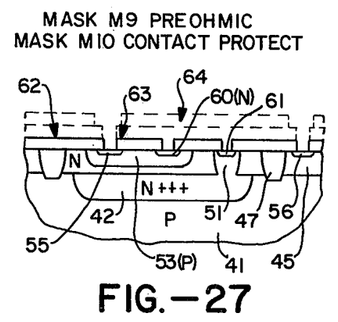

FIG. 9 shows the alignment key pattern on mask 18 (M9) which is utilized to open contact windows through the masking layer 57 to the base contact region 55 and to resistor 56. Again masks 18 in FIG. 9 and 19 in FIG. 10 are utilized in conjunction with a double photoresist layer 63 and 64 as shown in FIG. 27. FIG. 9 shows that there are two alignment keys on mask 18 at positions 8 and 10 for mask 9 to be aligned to aligning keys created by both masks 5 and 6. Mask 19 (M10) is aligned to mask 9 using an aligning key created at position 12.

There are four more masks in the overall sequence utilized in conjunction with separate photolithography operations to build up the two-level metal interconnect structure depicted in FIG. 28. Mask 11 is utilized to pattern the first metal layer 63 as shown in FIG. 28. Mask 12 is aligned to mask M11 and is utilized to define windows in the first deposited oxide layer 64. Mask M13, which is aligned to mask M12, is utilized to pattern the second metal layer 65 which is deposited over the oxide layer 64 and in the windows or vias created in that layer. Mask M14 is aligned to mask M13 and is utilized to open bonding pad windows in the top oxide passivation layer 66. These bonding pad windows are in the peripheral areas of the circuit which are not shown in FIG. 28.

From the above discussion it will be apparent that in connection with each photolithography operation using each photomask in sequence, the mask alignment operator must carefully refer to detailed alignment instructions for each photomask in order to be able to accurately and correctly identify the alignment key on the photomask and properly align it to the correct aligning key on the wafer produced by one or more prior photolithography operations. There is nothing on the photomask itself or on the wafer in the aligning key area which instructs the operator which is the alignment key or which is the proper aligning key to utilize in any particular instance. As is well known in the semiconductor industry, the result is that from time-to-time even skilled mask alignment operators make mistakes in mask alignment and defective wafers result.

FIGS. 11 through 20 depict a mask key alignment system in accordance with this invention which provides self-instructing mask alignment information on each photomask in the photomask set with respect to aligning keys produced on the wafer. For purposes of comparison, the same photomask sequence as depicted in connection with the prior art in FIGS. 1 through 10 will be utilized. Referring briefly back to FIGS. 1 through 10 it can be seen that the array of alignment key locations in this prior art approach is a linear array. In accordance with a preferred version of this invention as depicted particularly in FIG. 29, the alignment key array is a rectangular array of rows and columns which is preferably located in one corner of the multiple circuit topography patterns on a particular mask. However, a linear array could also be used with this invention. The same type of designation for alignment and aligning keys will be utilized in connection with the photomask set depicted in FIGS. 11 through 20 as was used in connection with the photomask set depicted in FIGS. 1 through 10.

As shown in FIG. 11, the first photomask 20 (M1) has a region 20A in which circuit topography patterns are formed and a preselected subarea 20B which is devoted to the alignment key pattern, this subarea being common on all of the photomasks in the set. There are two basic features to this invention which will become apparent from a consideration of FIGS. 11 through 13 which depict the first three photomasks in the photomask sequence. Consider first the first photomask and the aligning key 20D formed in the alignment key area 20B. This aligning key 20D is given the designation 1-1 indicating its being created by mask 1 in sequential location 1 in the rectangular array. (In FIG. 29 the positions of the rectangular array are designated A1 through A16 in the sequence shown.) Other sequences could obviously be utilized as long as uniformity is maintained by the design engineer so that the mask alignment operator will be able to utilize the same approach after once learning the self-instructing alignment key system of this invention.

Figure 13B:
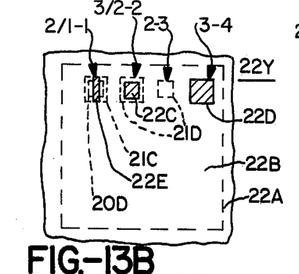
Figure 14B:
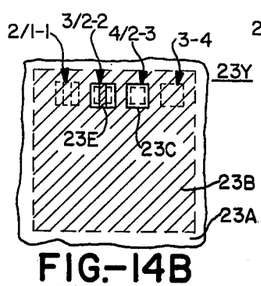
Figure 15B:
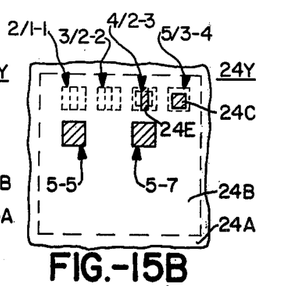
Figure 16B:
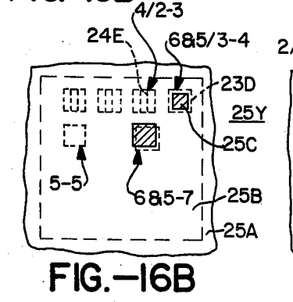
Figure 17B:
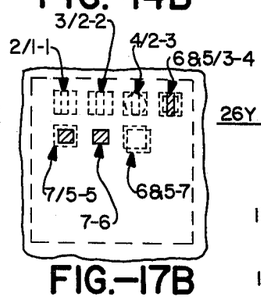

As shown in FIG. 12, the next photomask 21 (M2) has an alignment key 21C and two aligning keys 21D formed thereon in the alignment key subarea 21B. The mask key in the lowest position in the rectangular array, in this case at position 1, is the alignment key 21C and the other two mask keys 21D are the aligning keys for subsequent photomasks. In particular, the aligning key at position 2 is associated with photomask M3 as shown in FIGS. 13A and 13B and the aligning key at position 3 is associated with mask M4 as shown in FIGS. 14A and 14B. Consider now FIGS. 13A through 16A in comparison with FIGS. 13B through 16B. In FIGS. 13A through 16A each of the alignment keys on the respective masks is placed at the next subsequent key location in the key location sequence: that is, the alignment key for mask M3 in FIG. 13 is at position 2, the alignment key for mask M4 in FIG. 14 is at position 3, the mask alignment key for mask M5 in FIG. 15A is at position 4, and the mask alignment key for mask M6 in FIG. 16A is at position 5. If the remainder of the mask set in FIGS. 17A through 20A is examined, it is seen that, in each instance, the alignment key on each successive mask is assigned to the next key position in the array in going from one photomask sequence number to the next. However, considering FIGS. 13B through 16B, it is seen that the alignment key for masks M5 in FIG. 15B and M6 in FIG. 16B are in the same key position in the array. This is an alternative approach that can be used when two masks in sequence are both designed to be aligned to the topography created by the same prior mask. As will be seen, the self-instructing mask alignment information system of this invention is readily adapted to either of these approaches to assigning alignment key locations. It is seen, however, that one important general aspect of this invention is that on each successive mask in the mask set the alignment key thereon is assigned either to the same alignment key location as the immediately preceding photomask or to the next alignment key location in the array.

Referring again to FIGS. 13A through 16A in comparison to FIGS. 13B through 16B, it can be seen that, on each of the masks M3 through M6 in FIGS. 13A through 16A, an I-bar blot mark is formed at a key location immediately preceding the alignment key location on each individual photomask, whereas this is true only of masks M3 through M5 and not of mask M6 in FIGS. 13B through 16B. This leads to the second important aspect of the self-instructing mask alignment system of this invention, which is that the presence of the I-bar blot mark on a mask indicates to the photomask alignment operator that the alignment key which is the mask key at the next key location in the array is to be aligned to the aligning key on the wafer which is at the second key position after the last I-blot mark, if any, produced on the wafer during prior photolithography and related process steps. The absence of an I-bar blot mark on the mask instructs the photomask alignment operator that the alignment key which is always in the first key location in the array on each mask is to be aligned to the first aligning key on the wafer after the last I-bar blot mark, if any, produced during prior photolithography and related process steps.

Another important aspect of this invention is, of course, that the aligning keys, if any, formed on each photomask are formed at key locations corresponding to the designated alignment key locations for associated higher numbered photomasks which are designed to be aligned to the topography created by that particular photomask. This is a natural concomitant of the concept of aligning and alignment keys. However, it is the generally sequential assignment of designated alignment key locations on successive photomasks together with the I-bar blot mark which provides the self-instructing feature of the mask alignment key system of this invention.

Referring back to FIG. 12, it is seen that the mask alignment operator in viewing the alignment key pattern will immediately note that there is no I-bar blot pattern thereon and will thus know to align the first key (i.e. the alignment key) 21C to the aligning key next to the last I-bar blot pattern, if any, on the wafer. The operator will then notice that there is no I-bar blot pattern on the wafer and will thus know to align the alignment key at location 1 to the only existing aligning key at location 1 on the wafer. There can be no mistaking of which is the alignment key on the mask since it is, in accordance with this invention, always the mask key located in the lowest key location in the array.

Referring to FIG. 13A and to FIG. 13B, it is seen that in the process of aligning this photomask M3, the photomask alignment operator will first note that there is an I-bar blot mark on the mask. This will instruct the operator that the alignment key which is at the next key location (location 2) should be aligned to an aligning key at two key locations after the last I-bar blot mark, if any, on the wafer. The operator will see that there is no I-bar blot mark on the wafer and will thus know to align the alignment key at position 2 to the aligning key at position 2 on the wafer. No reference to extrinsic alignment key instructions are required since the self-instructing feature of this invention gives the operator all the information that is required.

Referring now to FIGS. 14A and 14B, an operator working with mask M4 will note the presence of the I-bar blot mark on the mask and will be, as previously indicated, instructed by it to align the alignment key at the next key location to the aligning key on the wafer which is two key locations after the last I-bar blot mark on the wafer. In this case the I-bar blot mark on mask M3 has been reproduced on the wafer at location 1 as shown in FIGS. 14A and 14B so the operator will know to align the alignment key to the aligning key at location 3, two locations thereafter. The operator will take the same approach to the mask M5 shown in either of the alternative versions of FIGS. 15A and 15B since in each instance the I-bar blot mark is present on the mask. The mask version of M6 depicted in FIG. 16A also has the I-bar blot mark on it and would instruct the operator to align the alignment key in the next key location in the next line to the aligning key at the second key location away from the last I-bar blot mark which is recorded on the wafer at position 3. However, the mask version of mask M6 in FIG. 16B does not have an I-bar blot mark on it and this instructs the operator to align the mask alignment key to the already previously used aligning key at the key location immediately after the last I-bar blot mark on the wafer at location 3.

Referring to FIGS. 17 through 20, it will be seen that each masks M7 through M10 includes an I-bar blot mark thereon so the mask alignment operator will treat each of these masks the same as previously described. The remaining masks in the alternate mask set following FIG. 16 would also each have I-bar blot marks thereon but at different locations. The operator does not need to be concerned about knowing the actual array location of either the I-bar blot mark or the alignment key since the correct alignment will be achieved following the simple instruction to align the alignment key next to the I-bar blot on the mask to an aligning key on the wafer which is two key locations away from the last I-bar blot mark recorded thereon in each instance.

FIG. 19 illustrates that in certain instances it may be desirable to form two aligning keys at the same location on the wafer where it is desired that a subsequent photomask be accurately aligned with respect to the topography of two prior photomasks. In the prior art arrangement as shown in FIG. 9, two separate alignment keys were utilized with respect to two separate aligning keys on the wafer to assure good alignment with topography created using both photomasks M5 and M6. In this case in accordance with the mask alignment key system of this invention, the self-instructing feature would be much more complicated if two alignment keys were created on the same mask. Instead a single alignment key is formed on mask M9 and is aligned with two independently created aligning keys in the same location on the wafer. It would be possible to adapt the principles of this invention to the use of two alignment keys on a mask for aligning to two separate aligning keys on the wafer. However, to accommodate this adaptation, the next photomask in the operator would have to have a third instruction to the effect that the presence of two I-bar blot marks on the mask indicate that the alignment key on the mask following the second blot mark should be aligned to an aligning key three key locations after the last I-bar blot mark recorded on the wafer. In most semiconductor processes this requirement for aligning to two separate prior photomasks topographies is a rare situation but it can be handled in either of the ways described.

Figure 29:
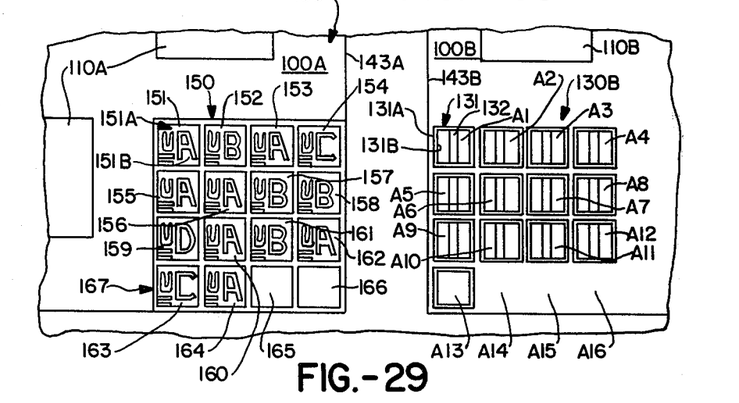
FIG. 29 illustrates generally the topographical layout and positioning of an alignment key pattern area together with a mask coding pattern area on adjacent integrated circuit chip on a wafer.

FIG. 29 depicts the positional relationship between the alignment key array 130B of this invention and a mask coding pattern 150 on an integrated circuit chip. The mask coding pattern 150 comprises a prearranged marked array of geometric areas 151, 152, etc., together with a preselected indicia located in a prearranged one of the geometric areas indicating the particular mask sequence number for each of the photomasks in the set. Accordingly, the square geometric area 151 cooresponds to the first photomask M1 and the indicia, in this case a critical dimension pattern 151A is located in area 151 to indicate that it corresponds to mask number 1. This mask coding pattern arrangement is taught in a copending and commonly assigned patent application entitled "System for Specifying Critical Dimensions, Sequence Numbers and Revision Levels on Integrated Circuit Photomasks", Ser. No. 222,254, filed Jan. 2, 1981. This copending patent application is incorporated by reference herein for its teaching of the mask coding pattern. Each of the photomasks in a mask set includes the marked array 167 in the form of the pattern of squares (or other pattern array) with the indicia in a single one of the geometric areas thereof. FIG. 29 depicts the mask coding pattern after all of the fourteen photomasks in a particular mask set have been utilized.

The combining of this mask coding pattern together with the alignment key array enables the marked array of geometric areas of the mask coding pattern to be utilized for rough alignment of the photomasks to the topography created already on the wafer since the lines of the marked array in the mask coding pattern can be roughly aligned with those appearing on the wafer from previous photomasks. This is especially useful in connection with dark field photomasks such as those shown in FIGS. 12, 14, 18, and 20. Since the mask key pattern area is generally opaque in dark field photomasks but the mask coding pattern area is a light field area, the mask coding pattern area can be utilized for rough alignment. This rough alignment should bring the aligning key on the wafer generally into the window of the alignment key in the dark field alignment key region of the photomask so that the fine alignment of the mask alignment key on the wafer to the aligning key can be readily accomplished.

As shown in FIG. 29, the alignment key pattern area 130B is located in the bottom lefthand corner of circuit topography pattern 130B on the wafer whereas the mask coding pattern area 150 is located on the bottom righthand corner of an adjacent circuit topography 100A. This same position relationship would occur on each photomask and would occur for each of the multiple circuit topography patterns thereon. The intervening space between the circuit topography patterns, i.e., the space between the dashed scribe line edges 143A allows for scribing of the integrated circuit wafer into individual integrated circuit die.

This invention is not limited to placing the alignment key pattern area and/or the mask coding pattern area in any particular location on the circuit topography patterns of individual photomasks. However, placing the two arrays in the position shown in FIG. 29 facilitates the mask alignment operator switching from viewing the mask coding pattern area to verify proper photomask selection and rough alignment to the alignment key pattern area for fine alignment of the photomask to the wafer.

As shown in FIG. 29, a rectangular array of rows and columns of alignment key locations is preferred for this invention. It should be understood, however, that the invention is not limited to a rectangular array and the linear array shown in the prior art system in FIGS. 1 through 10 could also be employed. The rectangular array placed in one corner of each topography pattern on the mask is preferred since the corner areas are the last valuable areas of real estate on an integrated circuit chip and the rectangular array positioned in one corner has the least impact on the placement of bonding pads such as 110A and 110B around the periphery of each integrated circuit.

As an example of the sizes of the alignment key area 130B and the individual alignment key geometries, the area 130B may be about 150 micrometers square with each of the larger square keys being 32 micrometers, each of the smaller squares being 28 micrometers, and 5 micrometers between key pairs.

Figure 30:
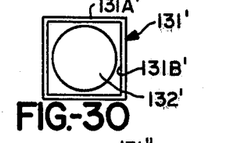
FIGS. 30 and 31 depict alternative used key pair blot marks which may be utilized in accordance with the alignment key system of this invention.
Figure 31:
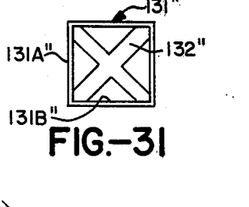
Figure 32:
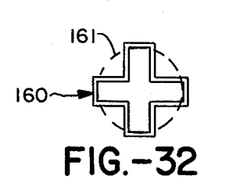
FIGS. 32 and 33 depict alternative alignment key and blot mark geometries which may be utilized in accordance with this invention.
Figure 33:
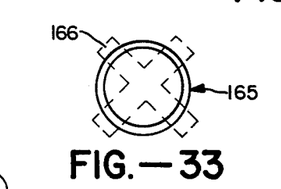

As shown in FIGS. 30 and 31, this invention is not limited to the use of an I-bar blot mark with respect to generally square alignment key pairs but other types of blot marks such as the circular blot mark 132' in FIG. 30 or the X mark 132" in FIG. 31 could be employed. Moreover, the invention is not limited to the use of square or rectangular alignment key geometries since, as shown in FIGS. 32 and 33, cross-shaped alignment keys 160 or circular alignment keys 165 could also be utilized. Any other regular geometric configuration for alignment keys could also be utilized. The only requirement for the blot mark is that it be readily distinguishable from the alignment keys so that it is readily visible on the wafer and on the photomask.

While this invention has been described in connection with a set of photomasks to be utilized in a bipolar integrated circuit manufacturing process, it should be apparent that the invention could be applied to any set of photomasks utilized for any of the other types of semiconductor processing technologies since the requirements for photomask alignment are generally the same for all of these technologies. Accordingly, although the invention has been described in connection with certain preferred embodiments thereof and in connection with an exemplary process technology, it should be apparent that numerous modifications could be made therein without departing from the scope of the invention as claimed in the following claims.

What is claimed is:

1. In a method for providing self-instructing mask alignment information on a set of photomasks designed to be used in number sequence during sequential photolithography steps in processing semiconductor wafers into integrated circuits wherein the topography pattern on each photomask in said set except the first one is required to be aligned to the wafer topography pattern created by use of at least one predetermined lower number photomask in accordance with a predetermined mask alignment formula for said set, the steps of:

selecting prior to photomask design and generation a common photomask subarea to be used as an alignment key pattern area on each photomask in said set, said alignment key pattern area having an array of sequential key locations;

designating for each photomask after the first one an alignment key location which is either the same alignment key location as the immediately preceding photomask or the next alignment key location in said array;

forming on the first photomask of said set a mask key pattern comprising aligning keys for all associated higher number photomasks designed in accordance with said mask alignment formula to be aligned to the topography created by use of said first photomask, each of said aligning keys being formed at key locations corresponding to said designated alignment key location for said associated photomask;

forming on each of the remaining photomasks of said set a mask key pattern comprising an alignment key at said designated alignment key location and aligning keys for any associated higher numbered ones of said photomasks designed in accordance with said mask alignment formula to be aligned to topography created by use of each said photomask, each of said aligning keys being formed at a key location corresponding to said designated key location for said associated photomask; and forming on each photomask having a mask sequence number greater than two and being the first photomask in said set to have a particular designated alignment key location, a used key pair blot mark at a key location immediately preceding said designated alignment key location for said mask.

2. The method of claim 1, wherein said array of assigned key locations is a rectangular array of rows and columns of key locations, said selected subarea is one corner of each circuit topography pattern on said photomasks, and said method further comprises the steps of:
    selecting prior to photomask design and generation a second common photomask subarea in a corner of each circuit topography pattern on said photomasks adjacent said one corner containing said array of assigned key locations; and
    forming on each of said photomasks a light field mask coding pattern in said mask coding pattern area, said mask coding pattern comprising a prearranged marked array of geometric areas together with a preselected indicia located in a prearranged one of said geometric areas indicating the particular mask number for each of said photomasks.

3. In a process for the design and manufacture of integrated circuit chips, the steps of:
    designing a set of photomasks required to be utilized in number sequence to perform sequential photolithography steps in conjunction with a particular semiconductor integrated circuit fabrication process while leaving a prearranged common subarea on each of said photomasks free of circuit topography to be utilized as an alignment key pattern area, said alignment key pattern area having an array of sequential key locations;
    designating for each photomask after the first one an alignment key location which is either the same location as the immediately preceding photomask or the next location in said array;
    forming on the first photomask of said set a mask key pattern comprising aligning keys for all associated ones of said photomasks designed to be aligned to the topography created by use of said first photomask, each of said aligning keys being formed at a key location corresponding to said assigned key location of said associated aligned photomask;
    forming on each of the remaining photomasks of said set a mask key pattern comprising an alignment key at said designated key location for said mask together with aligning keys for any associated higher numbered ones of said photomasks designed to be aligned to the topography pattern created by use of said photomask, each of said aligning keys being formed at said assigned key location of said associated aligned photomask;
    forming on each photomask having a mask sequence number greater than two and being the first photomask in the set to have a particular designated alignment key location a used key pair blot mark at a key location immediately preceding said designated alignment key location for said mask; and
    performing on a semiconductor wafer a prearranged sequence of process steps including a prearranged sequence of photolithography processing steps each using one of said photomasks in sequence, each of said photolithography processing steps utilizing photomasks having a mask sequence number higher than one including the step of aligning the photomask to the existing circuit topography on said wafer by aligning said alignment key on said photomask at said designated key location to the aligning key reproduced on said wafer at said designated key location as a result of a prior photolithography process step using an associated lower number photomask utilizing the used key pair blot marks, if any, reproduced on said wafer as a result of prior photolithography process steps as a self-instructing guide to mask alignment so that said step of aligning photomasks having a blot mark thereon is facilitated by aligning the alignment key after the blot mark on the mask to the aligning key reproduced on said wafer at two locations after the last blot mark, if any, on the wafer, and said step of aligning photomasks having no blot mark thereon is facilitated by aligning the alignment key on the mask to the aligning key reproduced on the wafer at one key location after the last blot mark, if any, created on the wafer.

4. The method of claim 3, wherein said array of assigned key locations is a rectangular array of rows and columns of key locations, said selected subarea is one corner of each circuit topography pattern on said photomasks, and said method further comprises the steps of:
    selecting prior to photomask design and generation a second common photomask subarea in a corner of each circuit topography pattern on said photomasks adjacent said one corner containing said array of assigned key locations; and
    forming on each of said photomasks a light field mask coding pattern in said mask coding pattern area, said mask coding pattern comprising a prearranged marked array of geometric areas together with a preselected indicia located in a prearranged one of said geometric areas indicating the particular mask number for each of said photomasks.

5. In a process for the design and manufacture of integrated circuit chips using a set of photomasks in number sequence during sequential photolithography steps invovled in a particular semiconductor integrated circuit fabrication process with at least one of said photomasks being an opaque dark field photomask, the steps of:
    designing said set of photomasks while leaving first and second prearranged common subareas on each of said photomasks free of circuit topography, said first common subarea to be utilized as a mask coding pattern area and said second common subarea to be utilized as an alignment key pattern area with said alignment key pattern area having an array of sequential key locations;
    forming on each of said photomasks at the time of photomask generation a light field mask coding pattern in said mask coding pattern area, said mask coding pattern comprising a prearranged marked array of geometric areas together with a preselected indicia located in a prearranged one of said geometric areas indicating the particular mask sequence number for each of said photomasks;
    designating for each photomask after the first one an alignment key location which is either the same location as the immediately preceding photomask or the next location in said array of sequential key locations;
    forming on the first photomask of said set at the time of photomask generation a mask key pattern comprising aligning keys for all associated ones of said photomasks designed to be aligned to the topography pattern created by use of said first photomask, each of said aligning keys being formed at said designated alignment key location for said associated aligned photomask;
    forming on each of the remaining photomasks of said set a mask key pattern comprising an alignment key at said designated alignment key location together with aligning keys for any associated higher number ones of said photomasks designed to be aligned to topography created by use of said photomask, each of said aligning keys being formed at said designated alignment key location of said associated aligned photomask;

forming on each photomask having a mask sequence number greater than two and being the first in said set to have a particular designated alignment key location a used key pair blot mark at a key location immediately preceding said designated alignment key location for said mask;

performing on a semiconductor wafer a prearranged sequence of processing steps including a prearranged sequence of photolithography processing steps each using one of said photomasks in sequence, each of said photolithography processing steps using a photomask which has a mask sequence number greater than one and is a light field photomask including the step of aligning the photomask to the existing circuit topography pattern on said wafer by aligning said alignment key on said photomask at said designated key location to the aligning key reproduced on said wafer at said designated key location as a result of a photolithography process step using an associated lower number photomask and utilizing used key pair blot marks, if any, reproduced on said wafer as a result of prior photolithography process steps together with a used key pair blot mark, if any, on said mask as self-instructing mask alignment guides so that said step of aligning said light field photomasks having a blot mark thereon is facilitated by aligning the alignment key after the blot mark on the mask to the aligning key on said wafer located two key locations after the last blot mark, if any, previously created on the wafer and said step of aligning light field photomasks having no blot mark thereon is facilitated by aligning the alignment key on the mask to the aligning key on said wafer located one key location after the last blot mark, if any, previously created on the wafer, and each of said photolithography processing steps using a mask having a sequence number greater than one and being a dark field mask including the steps of first coarsely aligning the photomask to the existing circuit topography pattern on said wafer by aligning said light field mask coding pattern on said mask with the mask coding pattern produced on said wafer as a result of prior photolithography processing steps and then finely aligning the photomask to the existing circuit topography on said wafer by aligning said alignment key on said photomask at said designated key location to the aligning key produced on said wafer at said designated alignment key location as a result of a photolithography processing step using an associated lower number photomask.

6. The method of claim 5, wherein said array of assigned key locations is a rectangular array of rows and columns of key locations and said selected first and second common subareas comprise adjacent corners of each of a plurality of identical circuit topography patterns on each said photomask.

7. In a set of photomasks adapted to be used in number sequence during sequential photolithography process steps in an overall process for manufacturing integrated circuit chips on a semiconductor wafer, a mask key pattern formed in a common subarea of each photomask preselected to remain free of circuit topography patterns and to serve as an alignment key pattern area having an array of sequential key locations, each of said photomasks after the first one having a designated alignment key location which is either the same location as the immediately preceding photomask in the sequence or the next location in said array, said mask key pattern on first photomask of said set comprising aligning keys for all associated higher number photomasks designed to be aligned to the topography pattern created by use of said first photomask, each of said aligning keys being formed at a key location corresponding to said designated key location for said associated aligned photomask, said mask key pattern on each of the remaining photomasks comprising an alignment key at a key location corresponding to said designated key location together with aligning keys for any associated higher number ones of said photomasks designed to be aligned to topography created by use of each said photomask, each of said aligning keys being formed at a key location corresponding to said designated key location for said associated aligned photomask, each of said photomasks having a mask sequence number greater than two and being the first in said set to have a particular designated alignment key location also having a used key pair blot mark formed at a key location immediately preceding said designated alignment key location for said mask.

8. The photomask set of claim 7, wherein said array of assigned key locations is a rectangular array of rows and columns of key locations, said selected subarea is one corner of each circuit topography pattern on said photomasks, and said method further comprises the steps of:

selecting prior to photomask design and generation a second common photomask subarea in a corner of each circuit topography pattern on said photomasks adjacent said one corner containing said array of assigned key locations; and forming on each of said photomasks a light field mask coding pattern in said mask coding pattern area, said mask coding pattern comprising a prearranged marked array of geometric areas together with a preselected indicia located in a prearranged one of said geometric areas indicating the particular mask number for each of said photomasks.

9. In a set of photomasks adapted to be used in number sequence during sequential photolithography process steps in an overall process for manufacturing integrated circuit chips on a semiconductor wafer, a mask key pattern formed in a common subarea of each photomask preselected to remain free of circuit topography patterns and to serve as an alignment key pattern area having an array of assigned key locations, said mask key pattern on each photomask including one or both of aligning and alignment keys at locations predetermined by the mask alignment formula for said overall process so that each photomask after the first may be aligned to the topography pattern of said wafer using an alignment key on said mask and an associated aligning key created on said wafer as a result of a photolithography operation using a prior photomask, at least some of said mask key patterns further including a used key pair blot mark at a key location immediately preceding the key location of said alignment key thereon to assist in aligning said photomasks.

* * * * *